United States Patent

Hasegawa et al.

[11] Patent Number: 5,871,587
[45] Date of Patent: Feb. 16, 1999

[54] PROCESSING SYSTEM FOR SEMICONDUCTOR DEVICE MANUFACTURE OF OTHERWISE

[75] Inventors: Takayuki Hasegawa, Yokohama; Hidehiko Fujioka, Utsunomiya; Yoshito Yoneyama, Kawasaki, all of Japan

[73] Assignee: Canon Kabushiki Kaisha, Tokyo, Japan

[21] Appl. No.: 625,710

[22] Filed: Apr. 3, 1996

Related U.S. Application Data

[63] Continuation of Ser. No. 414,723, Mar. 31, 1995, abandoned.

[30] Foreign Application Priority Data

Apr. 8, 1994 [JP] Japan ..................................... 6-095676
Mar. 28, 1995 [JP] Japan ..................................... 7-069611

[51] Int. Cl.$^6$ .............................. C23C 16/00; G21K 5/00
[52] U.S. Cl. ........................... 118/719; 378/34; 118/715; 118/722
[58] Field of Search .................................. 118/715, 719, 118/722; 378/34

[56] References Cited

U.S. PATENT DOCUMENTS 5,353,323  10/1994  Hirokawa .................................. 378/34

FOREIGN PATENT DOCUMENTS

| A0322205 | 6/1989 | European Pat. Off. . |
| A3940405 | 6/1990 | Germany . |
| 61-096344 | 5/1986 | Japan . |
| 62-066039 | 3/1987 | Japan . |
| 62-268941 | 11/1987 | Japan . |
| A03175224 | 7/1991 | Japan . |

OTHER PUBLICATIONS

Patent Abstracts of Japan, vol. 15, No. 416 (M–1172), Oct. 23, 1991.
Patent Abstracts of Japan, vol. 011, No. 263 (M–619) Aug. 26, 1987.
Patent Abstracts of Japan, vol. 010, No. 273 (M–518) Sep. 17, 1986.
Patent Abstracts of Japan, vol. 12, No. 149 (M–694), May 10, 1988.

*Primary Examiner*—Richard Bueker
*Attorney, Agent, or Firm*—Fitzpatrick, Cella, Harper & Scinto

[57] ABSTRACT

A processing system includes a processing chamber, a circulating device for purifying an inside ambience gas of the processing chamber and for circulating the purified gas back into the processing chamber, a measuring device for measuring the purity of the ambience gas, and an adjusting device for adjusting the purification capacity of the purifying device in accordance with an output of the measuring device. In another form, a processing system includes a first processing chamber in which a first process is to be performed therein, a second processing chamber in which a second process is to be performed therein, and a device for introducing an ambience gas, having been used in said first processing chamber for the first process, into the second chamber for reuse thereof. The gas subsequently used in the second chamber is introduced back into the first chamber for reuse of the gas. At least a portion of the circulated gas is purified to improve its purity. A purity sensor detects the purity of gas discharged from the second chamber and, in accordance with the detection, the capacity of gas purification is adjusted.

11 Claims, 5 Drawing Sheets

PROCESSING SYSTEM FOR SEMICONDUCTOR DEVICE MANUFACTURE OF OTHERWISE

This application is a continuation of application Ser. No. 08/414,723 filed Mar. 31, 1995, which is now abandoned.

FIELD OF THE INVENTION AND RELATED ART

This invention relates to a processing system which is suitable for semiconductor device manufacture.

X-rays, which are considered effective as exposure light for an exposure apparatus, are attenuated considerably by atmosphere, and for this reason, X-rays are introduced usually into an exposure chamber through a beam duct having an ultra-high vacuum maintained therein. The exposure chamber serves to prevent attenuation of the X-rays and, it is a reduced pressure chamber having a reduced inside pressure ambience filled with a helium gas, for accelerating heat radiation from a wafer or a mask. The pressure or temperature of this reduced pressure ambience or the purity of the helium gas is controlled very precisely to prevent any change in intensity of the X-rays at the surface of a wafer to be exposed.

The purity of helium gas might be adversely affected by leakage which would decrease due to the degree of gas-tightness of the chamber, leakage of a gas into the chamber through an inside wall of the chamber or from air bearing means, for example, used in a mask holding device or a wafer positioning stage device. In order to dilute such impurity gas to keep the helium gas purity within the reduced pressure chamber not lower than 99.9%, it is necessary to supply continuously a high purity helium gas with a purity not lower than 99.9999% into the reduced pressure chamber.

SUMMARY OF THE INVENTION

As described, helium gas of high purity has to be supplied continuously. Also, the helium gas to be supplied is for use in the exposure chamber only. Thus, the efficiency of use of helium gas is quite low. Also, consumption of a large quantity of expensive helium gas directly results in increased running cost.

It is accordingly an object of the present invention to provide a processing system by which the efficiency of use of ambient gas is improved which reduces the running cost considerably.

In accordance with an aspect of the present invention, there is provided a processing system, comprising: a processing chamber; circulating means for purifying an inside ambience gas of said processing chamber and for circulating the purified gas back into said processing chamber; measuring means for measuring the purity of the ambience gas; and adjusting means for adjusting the purification capacity of said purifying means in accordance with an output of said measuring means.

In accordance with another aspect of the present invention, there is provided a processing system, comprising: a first processing chamber in which a first process is to be performed; a second processing chamber in which a second process is to be performed; and means for introducing an ambience gas, having been used in said first processing chamber for the first process, into said second chamber for reuse.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[Embodiment 1]

Figure 1:
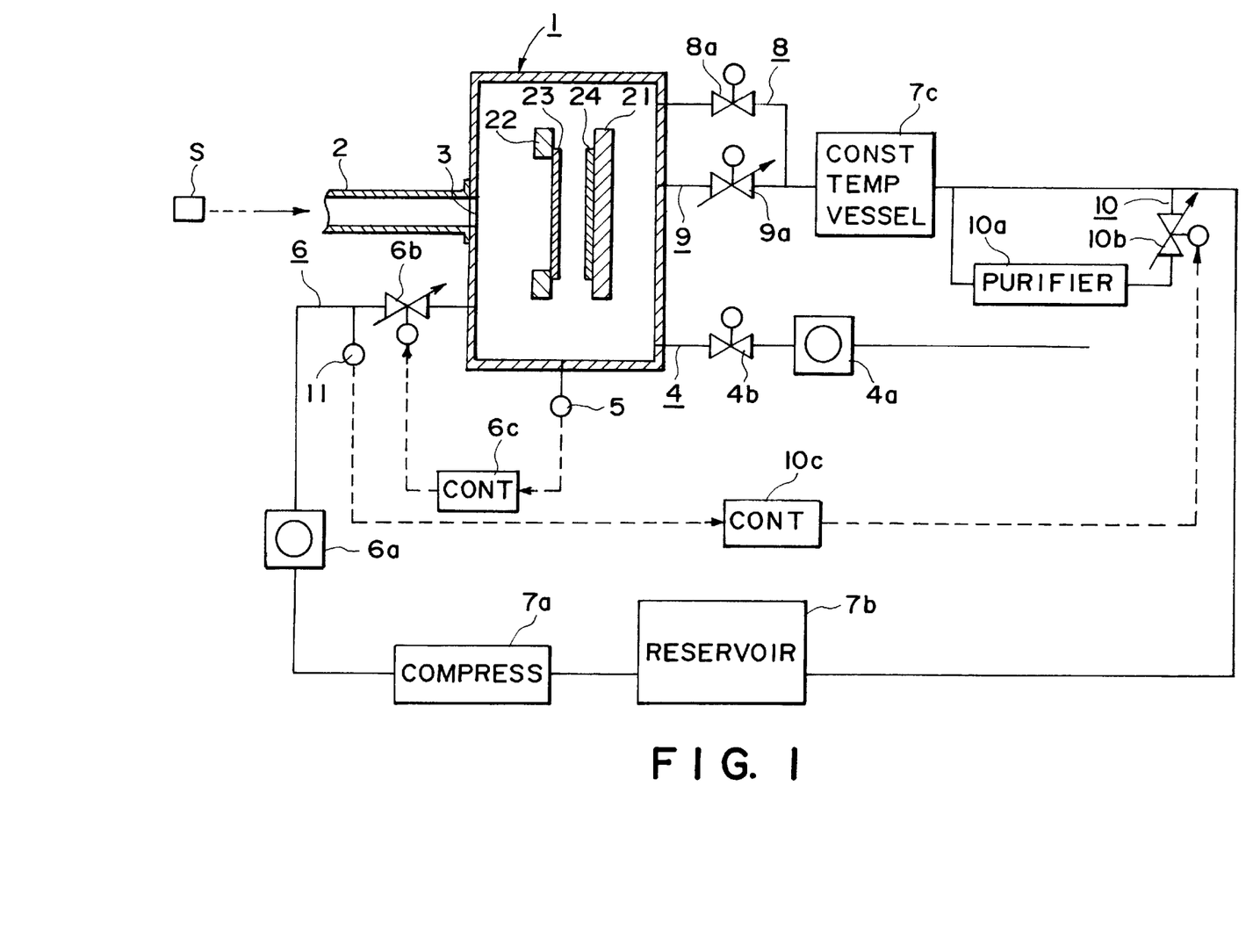
FIG. 1 is a schematic view of a processing system according to a first embodiment of the present invention.

FIG. 1 shows an exposure process system which is a processing system according to a first embodiment of the present invention.

Reduced pressure chamber 1 accommodates therein a wafer positioning stage (substrate holding means) 21 and a mask holding device 22. The reduced pressure chamber 1 is provided with a beam duct 2 for introducing, into the reduced pressure chamber 1, X-rays produced by a light source S such as a synchrotron radiation X-ray source, while maintaining an ultra high vacuum state.

The reduced pressure chamber 1 is further provided with a beryllium window 3 for intercepting the reduced pressure inside ambience of the reduced pressure chamber 1 from the ultra high vacuum ambience within the beam duct 2. The X-rays advancing along the beam duct 2 and introduced through the beryllium window 3 into the reduced pressure chamber 1, impinge on a mask 23 held by the mask holding device 22, and subsequently on a wafer (substrate) 24 held by the wafer positioning stage 21, whereby exposure of the wafer is performed.

For controlling the reduced pressure inside ambience of the reduced pressure chamber 1, the processing system is provided with a first evacuation line 4 for evacuating the reduced pressure chamber 1 to a predetermined vacuum degree (e.g., 0.13 Pa ($1 \times 10^{-3}$ Torr)) after the wafer or the mask is introduced into the reduced pressure chamber. The processing system is further provided with a second evacuation line (evacuation means) 6 for adjusting, after the predetermined vacuum degree is reached in the reduced pressure chamber 1, the vacuum degree within the reduced pressure chamber 1 on the basis of an output of a pressure sensor 5. The processing system is further provided with a helium gas supply line 7, which serves as ambient gas supplying means and also as evacuation and circulating means, for supplying a helium gas (ambient gas) into the reduced pressure chamber 1.

The first evacuation line 4 has a first vacuum pump 4a and an openable/closable valve 4b. The second evacuation line 6 has a second vacuum pump 6a, a flow rate controlling valve 6b and a controller 6c therefor. The controller 6c serves to control the flow rate controlling valve 6b on the basis of an output of the pressure sensor 5, to thereby adjust the degree of vacuum inside the reduced pressure chamber 1. The helium gas supply line 7 has a compressor 7a for collecting a discharged gas from the second evacuation line 6, and a reservoir 7b connected thereto.

The helium gas stored in the reservoir 7b is temperature controlled by means of a constant-temperature vessel 7c to a predetermined temperature, and the thus temperature controlled helium gas is introduced into the reduced pressure chamber 1 through a first helium gas introducing line 8 having an openable/closable valve 8a or a second helium gas introducing line 9 having a flow rate controlling valve 9a.

In operation, the reduced pressure chamber 1 is evacuated by the first evacuation line 4 to a predetermined vacuum level. Then, the valve 8a of the first helium gas introducing line 8 is opened, and a relatively large quantity of helium gas is supplied into the reduced pressure chamber 1 until the inside ambient gas of the chamber 1 reaches a predetermined ambience pressure, for example, 20000 Pa (150 Torr). Thereafter, the valve 8a of the first helium gas introducing line 8 is closed. Then, the flow rate control valve 9a of the second helium gas introducing line 9 is opened, and, while adding a predetermined flow rate of helium gas, the vacuum degree of the reduced pressure chamber 1 is adjusted by means of the second evacuation line 6 to maintain the predetermined ambient pressure mentioned above. Under the control of the reduced pressure inside ambience of the reduced pressure chamber 1 in the manner described above, the exposure process of a wafer 24 starts.

During the exposure process of the wafer 24, the purity of the helium gas inside the reduced pressure chamber 1 may decrease due to impurity gas leaked from the air bearing means of the wafer positioning stage 21, for example. In consideration of this possibility, adjustment of vacuum level through the second evacuation line 6 and replenishment of helium gas through the second helium gas introducing line 9 continue. Here, the helium gas (exhaust gas) discharged from the reduced pressure chamber 1 through the second evacuation line 6, is collected by the compressor 7a into the reservoir 7b.

The collected helium gas is circulated back into the reduced pressure chamber 1, together with the helium gas having been reserved in the reservoir 7b.

Provided between the reservoir 7b and the constant temperature vessel 7c of the helium gas supply line 7 is a helium gas purifying branched line 10 which serves as purity adjusting means, for purifying a portion of the helium gas supplied from the reservoir 7b to a high purity, and for flowing the purified gas, together with the remaining helium gas, into the constant temperature vessel 7c. This helium gas purifying line 10 has a helium gas purifier 10a and a flow rate control valve 10b.

The purifier 10a may have a filter, for example, for trapping gas molecules of active gas and for passing only inactive gas, to thereby purify the helium gas (inactive gas).

The second evacuation line 6 is provided with a purity sensor (purity detecting means) 11 for measuring the purity of helium gas discharged from the reduced pressure chamber 1. The flow rate control valve 10b of the helium gas purifying line 10 is provided with a controller 10c which is controlled in response to an output of the purity sensor 11, to change the flow rate of helium gas to be branched into the purifier 10a.

Since the helium gas to be supplied to the reduced pressure chamber 1 from the reservoir 7b of the helium gas supply line 7 contains helium gas collected from the second evacuation line 6, at least a portion thereof is directed to the purifier 10a for purification to improve the purity of the gas. The thus purity improved gas is then introduced into the reduced pressure chamber 1.

The purity of the helium gas within the reduced pressure chamber 1 may be measured by means of the purity sensor 11, provided in a portion of the second evacuation line 6, and the proportion of the helium gas to be purified by the purifier 10a may be changed in accordance with an output of the purity sensor 11 to adjust the purity of the helium gas just going to be replenished into the reduced pressure chamber 1. This allows extremely precise and quick control of the purity of the helium gas within the reduced pressure chamber 1.

The purity sensor 11 may comprise, for example, a sensor for directly detecting the gas purity or a sensor for measuring the temperature and sound speed in a gas to thereby indirectly detect the purity thereof. Any type of sensor may be used.

Figure 2:
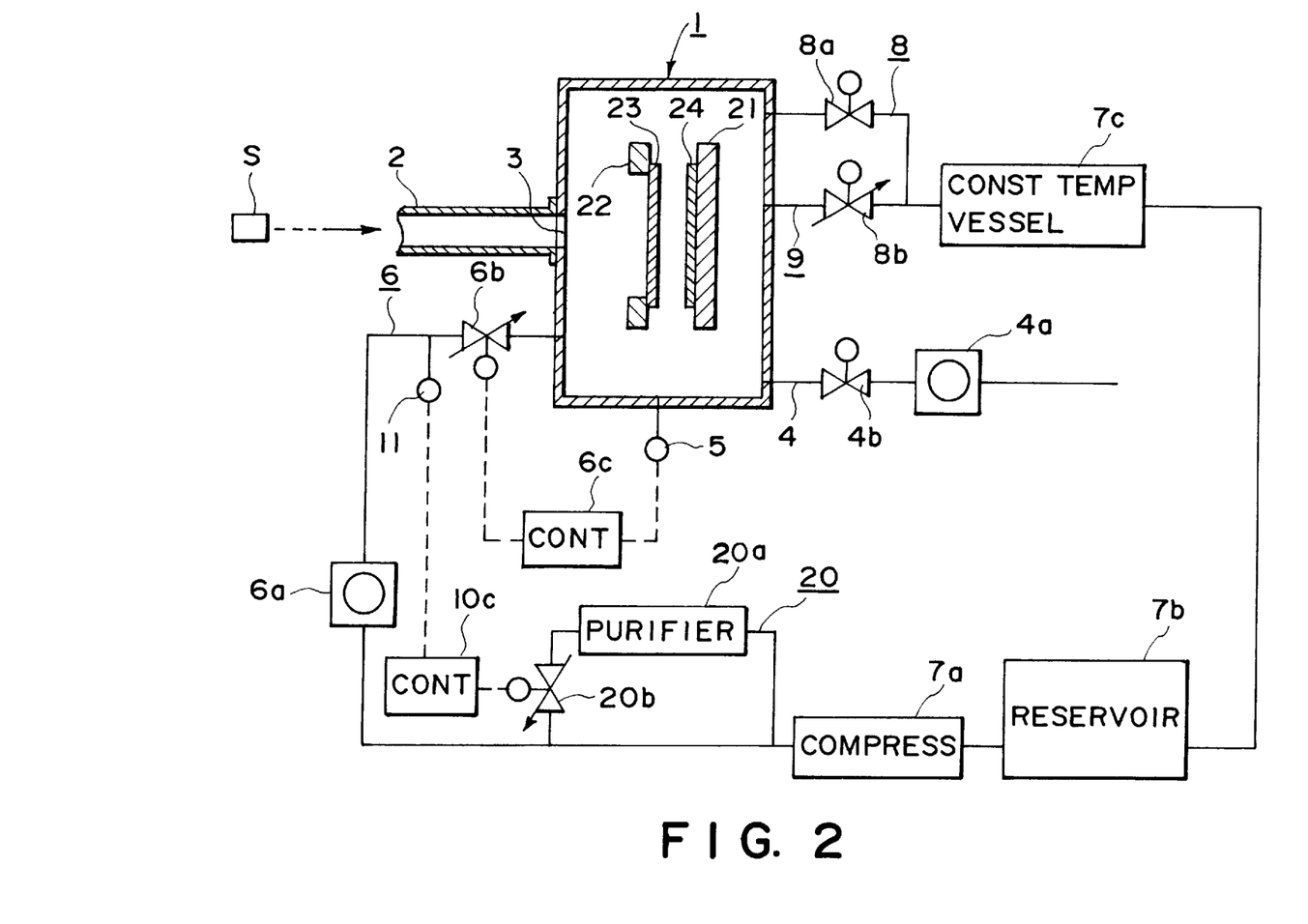
FIG. 2 is a schematic view of a modified form of the processing system of the FIG. 1 embodiment.

The helium gas purifying branched line 10 may be provided in any portion of the line for collecting the helium gas from the second evacuation line 6 and for circulating it back to the helium gas supply line 7. For example, as shown in FIG. 2, a helium gas purifying branched line 20, which has a purifier 20a and a flow rate control valve 20b, similarly to the helium gas purifying branched line 10 of this embodiment, may be provided between the second vacuum pump 6a and the compressor 7a.

In accordance with this embodiment of the present invention, as described hereinbefore, the helium gas discharged from the reduced pressure chamber is collected and reused. This effectively reduces the quantity of helium consumption as well as the running cost.

Additionally, the purity of helium gas discharged from the reduced pressure chamber may be directly measured so that any change in purity of the helium gas within the reduced pressure chamber can be detected. On the basis of this detection, the purity of helium gas to be replenished into the reduced pressure chamber may be changed. Thus, control of the purity of helium gas within the reduced pressure chamber can be done extraordinarily precisely. This accomplishes stable X-ray intensity and thus high precision X-ray lithography.

[Embodiment 2]

Figure 3:
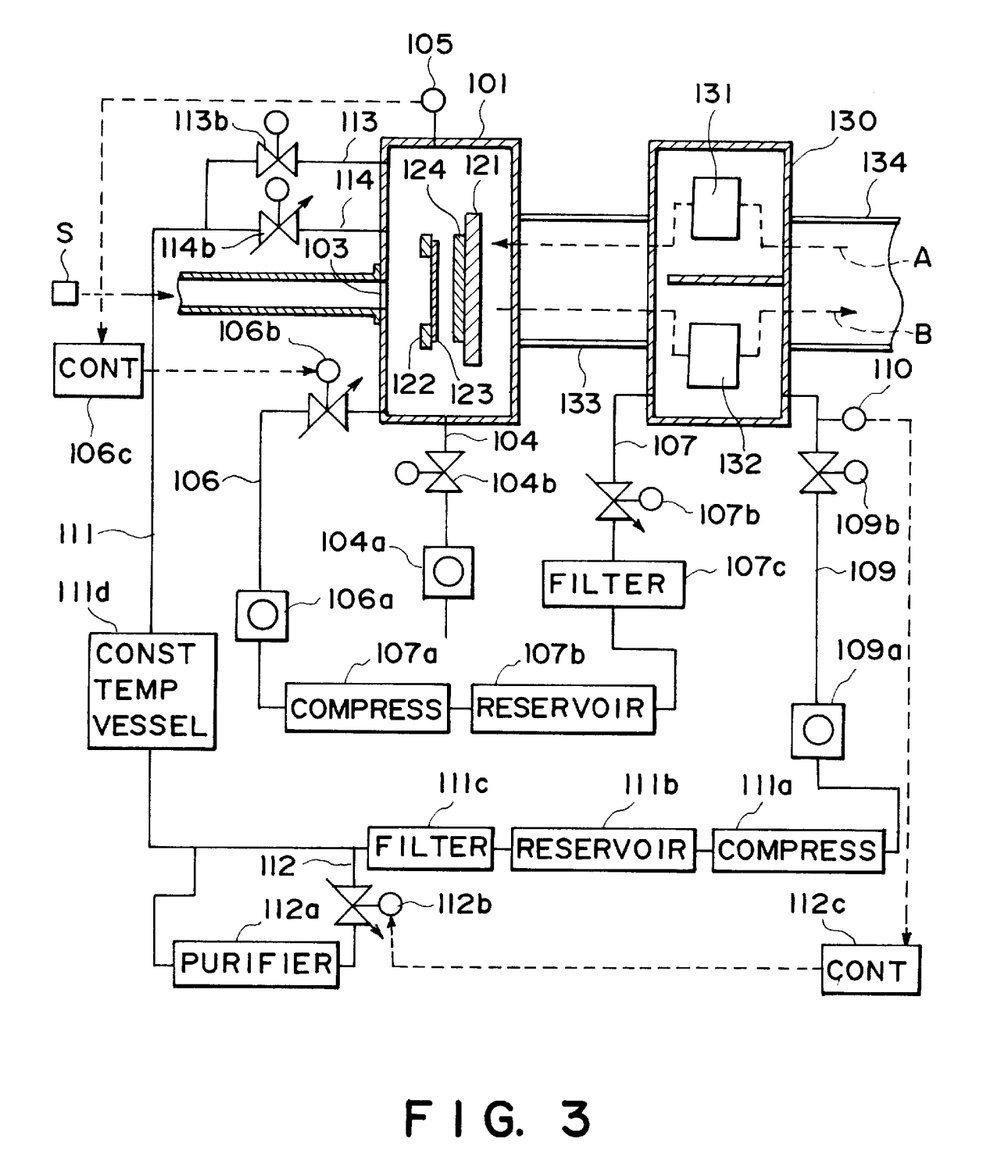
FIG. 3 is a schematic view of a processing system according to a second embodiment of the present invention.

Referring now to FIG. 3, a second embodiment of the present invention will be explained. In this embodiment, the invention is applied to an automated semiconductor device manufacturing line.

In FIG. 3, a first chamber (exposure chamber) 101 accommodates therein a wafer positioning stage (substrate holding means) 121 and a mask holding device 122. There is a beam line 102 for introducing into the first chamber 1, radiation X-rays produced by a radiation source S such as a synchrotron radiation source, while retaining an ultra-high vacuum. Also, there is an X-ray transmission window 103 for isolating reduced pressure inside ambience of the first chamber from the ultra high vacuum inside ambience of the beam line 102.

The X-rays advancing along the beam line 102 and introduced through the X-ray transmission window 103 into the first chamber 1, impinge on a mask 123 held by the mask holding device 122 and then on a wafer (substrate to be exposed) 124 placed on the wafer positioning stage 121, by which exposure of the wafer is performed. The radiation used for this exposure process may comprise vacuum ultra-violet rays, for example, and it is not limited to X-rays.

There is also a second chamber 130 in which a coater developer is accommodated. More specifically, a coater 131 for performing a resist coating process to a wafer as well as a developer 132 for performing a developing process to a wafer (after the exposure process), are accommodated in the same chamber.

Further, there is an in-line interface 133 for transfer of a wafer between the first chamber 101 and the second chamber 130. Automated guided vehicle line (AGV line) 134 is coupled to the second chamber 130, for conveyance of a wafer between the second chamber 130 and any other processing device.

In the manufacturing line of the structure described above, a wafer having been conveyed along the AGV line 134 moves along a line A in FIG. 3: that is, it moves through the coater 131 in the second chamber 130 and the in-line interface 133 and then into the exposure unit (first chamber) 101. After the exposure process is completed, the wafer moves along a line B in FIG. 3: that is it moves out of the first chamber 101 and through the in-line interface 133 and the developer 132 of the second chamber 130, and then onto the AGV line 134.

The present embodiment may be used with, as a resist (photosensitive material) to be applied to a wafer, a chemical amplification type resist having high resolution. Since however such chemical amplification type resists are easily oxidized in air and the resolution or sensitivity changes easily, in this embodiment all of the first chamber 101, the second chamber 130 and the in-line interface 133 are filled with helium gas (inactive gas) to prevent oxidation.

Next, details of an air conditioning system utilizing this embodiment will be described.

Coupled to the first chamber 101 are a first evacuation line 104 for discharging gases in the chamber out of the chamber, and a second evacuation line 106 for fine adjustment of the reduced pressure level of the chamber. The first evacuation line 104 is equipped with a first vacuum pump 104a and an openable/closable valve 104b. The second evacuation line 106 is provided with a second vacuum pump 106a and a flow rate control valve 106b. Controller 106c serves to control the flow rate control valve 106b on the basis of a detection output of a pressure sensor 1105 which serves to detect the inside pressure of the first chamber 101.

Also coupled to the first chamber 101 are a first helium gas introducing line 113 with an openable/closable valve 113b, for supplying high purity helium gas into the first chamber 101, and a second helium gas introducing line 114 having a flow rate control valve 114b whose degree of opening is adjustable.

In operation, the first chamber 101 is evacuated through the first evacuation line 104 so that a predetermined vacuum level is provided therein. After this, the valve 113b of the first helium gas introducing line 113 is opened, and a relatively large quantity of helium gas is supplied into the first chamber until a predetermined reduced pressure (e.g., 20000 Pa (150 Torr)) is provided in the chamber. Then, the valve 113b is closed.

The purity of helium gas within the first chamber 101 may decrease, due to mixture of outside air leaked from any chamber wall junction, for example, or leakage of impurity gas from air bearing means of the wafer positioning stage 121. This causes degradation of exposure precision. In this embodiment, evacuation through the second evacuation line 106 and supply (replenishment) of helium gas through the second helium gas introducing line 114 are continued to keep the helium purity not lower than 99.9%.

The helium gas discharged out of the first chamber by the second evacuation line 106, is compressed by a compressor 107a and is collected into a reservoir 107b. The helium gas supplied from this reservoir 107b is purified by a filter 107c, removing any impurities. Then, the pressure is reduced by a regulator 107d. Subsequently, through a helium supply line 107, the helium gas is introduced into the second chamber 130. The filter 107c comprises a fine particle filter for removing fine particles in the gas such as dust or other foreign particles, and a chemical filter for removing chemical substances such as amines.

Resist coating process or developing process to be performed in the second chamber 130 do not need helium gas of high purity, as compared with the exposure process to be performed in the first chamber 101. Thus, the exhausted gas from the first chamber is introduced into the second chamber 130 without purification. When the resist coating process with the coater 131 or the developing process through the developer 132 is to be performed, the inside ambience of the second chamber 130 is maintained at an atmospheric pressure or a reduced pressure.

Evacuation line 109 from the second chamber 130 is equipped with a vacuum pump 109a for evacuating the second chamber 130, a compressor 111a for compressing the discharged helium gas, and a reservoir 111b connected thereto. The discharged helium gas is stored into the reservoir 111b. The helium gas supplied from this reservoir 111b is purified by a filter 111c, removing any impurities. The purified helium gas is then temperature adjusted by a constant temperature vessel 111d, to a predetermined temperature. The filter 111c comprises a fine particle filter for removing fine particles in the gas such as dust or other foreign particles, and a chemical filter for removing chemical substances such as amines.

Provided between the reservoir 111b and the constant temperature vessel 111d is a helium gas purifying branched line 112 which serves to purify a portion of the helium gas supplied from the reservoir 111b, to a predetermined high purity, and direct the purified gas into the constant temperature vessel 111d. This gas purifying line 112 is provided with a helium gas purifier 112a and a flow rate control valve 112b.

The purifier 112a may comprise, for example, a filter for trapping gas molecules of active gas and for passing only inactive gas, to thereby improve the purity of helium (inactive gas). The helium gas having been used in the second chamber 130 and being circulated, has a lowered purity having been reduced by performance of the processes in the first and second chambers. Thus, by means of the filter 111c and the purifier 112a, the cleanness and gas purity of the helium are improved and, after this, the helium is supplied again into the first chamber.

An evacuation line from the second chamber 130 is provided with a purity sensor 110 for measuring the purity of the discharged helium gas. Controller 112c serves to control the degree of opening of the flow rate control valve 112b in accordance with a detection output of the purity sensor 110, to change the flow rate of helium gas to be branched into the purifier 112a to thereby change the purification capacity of the purifying means. This allows very precise and quick control of the purity of helium gas to be supplied into the first chamber 101, which chamber needs precise purity control. The purity sensor 110 may comprise, for example, a sensor for directly detecting the gas purity or a sensor for measuring the temperature and sound speed in a gas to thereby indirectly detect the purity thereof. Any type of sensor may be used.

The foregoing description and an example wherein the first chamber is a chamber for an exposure apparatus and the second chamber is a chamber for a coater and developer. However, a semiconductor manufacturing line may include, in addition to these processing devices, a sputtering device, a CVD (chemical vapor deposition) device, an epitaxial device, a diffusing device, an annealing device, and/or an inspecting device, for example. Like the embodiment described above, the invention is applicable also to these devices. Namely, the first and second chambers may be used for any combination of an exposure apparatus, a coating device, a developing device, a sputtering device, a CVD device, an epitaxial device, a diffusing device, an annealing device and an inspecting device. Alternatively, the first and second chambers may be used for the same devices.

In any case, by introducing an ambient gas used in the first chamber into the second chamber and by introducing, again, the ambient gas subsequently used in the second chamber back into the first chamber, effective use of gas is assured. Here, the device in the first chamber may preferably be one that needs higher cleanness and higher gas purity, as compared with the device in the second chamber. The ambient gas is not limited to helium (He). Inactive gases such as nitrogen ($N_2$) or argon (Ar), for example, may be used.

This embodiment of the present invention provides advantageous results, examples of which follow.

An exposure process to be performed in the first chamber 101 needs an ambient gas of higher cleanness and higher purity, as compared with the resist coating process or developing process to be performed in the second chamber 130. Further, the resist coating process and/or developing process to be performed in the second chamber has a possibility of largely damaging the cleanness and purity of ambient gas, as compared with the exposure process to be performed in the first chamber. For these reasons, an ambient gas of high purity is first supplied into the first chamber, and the gas used in the first chamber is then introduced into the second chamber for reuse.

The gas subsequently used in the second chamber is then purified, to improve or restore the cleanness and purity, and thereafter the gas is introduced again back into the first chamber. This increases the efficiency of use of gas considerably. Where the ambient gas consists of an expensive gas such as helium gas, for example, this provides a notable effect on decreasing the running cost.

The purity of ambient gas having been used in the first and second chambers is measured and, in accordance with the measured purity, the capacity of gas purification is adjusted. This enables ambient gas purity control of extraordinarily high precision.

[Embodiment 3]

Now, an embodiment of a device manufacturing method which comprises manufacturing processes, including a process to be performed through a processing system described with reference to any one of the foregoing embodiments, will be explained.

Figure 4:
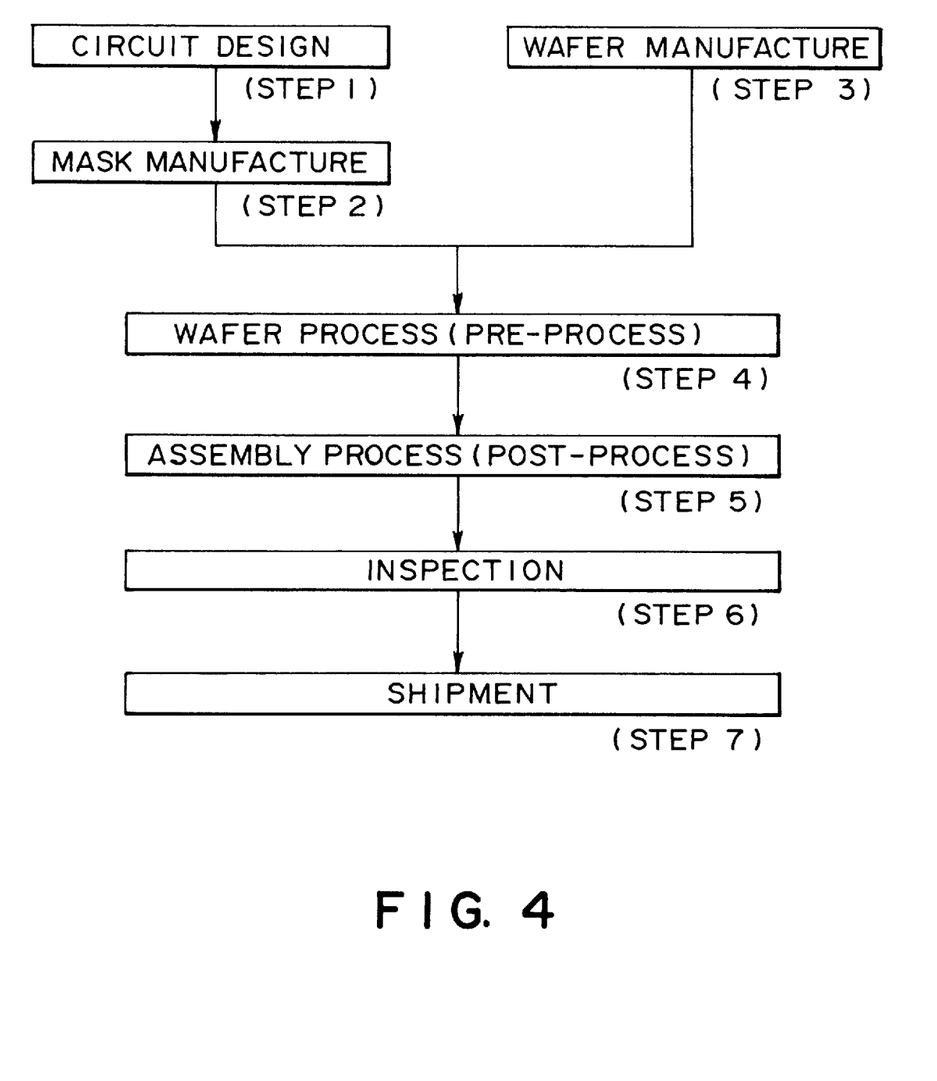
FIG. 4 is a flow chart of semiconductor device manufacturing processes.

FIG. 4 is a flow chart of the sequence of processes for manufacturing microdevices such as a semiconductor chip (e.g. IC or LSI), a liquid crystal panel, a CCD, a thin film magnetic head, or a micromachine, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so-prepared mask and wafer, circuits are formed on the wafer through lithography. Step 5 is an assembling step which is called a post-process wherein the wafer processed by step 4 is formed into semiconductor chips. This step includes assembling (dicing and bonding) and packaging (chip sealing). Step 6 is an inspection step wherein operability checks, durability checks and so on of the semiconductor devices produced by step 5 are carried out. With these processes, semiconductor devices are finished and they are shipped (step 7).

Figure 5:
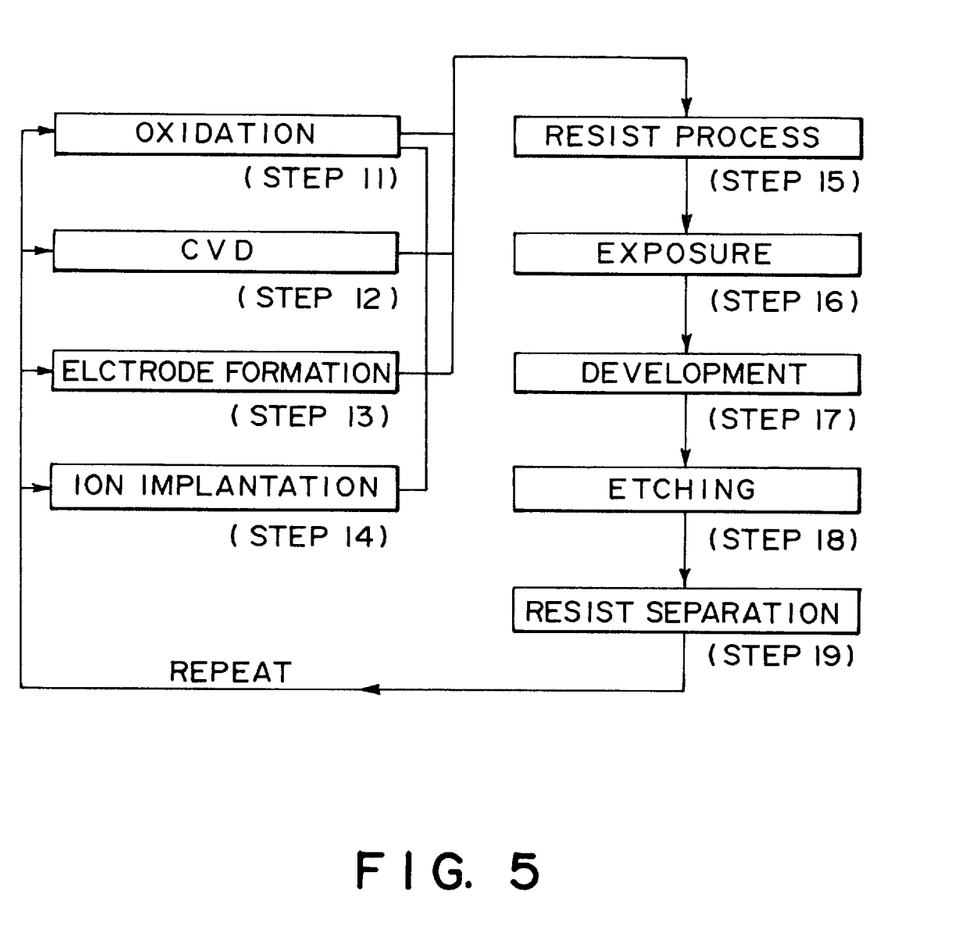
FIG. 5 is a flow chart of a wafer process of the processes of FIG. 4.

FIG. 5 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions in the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

The device manufacturing method of this embodiment enables manufacture of microdevices such as semiconductor devices of high density, with lowered cost.

While the invention has been described with reference to the structures disclosed herein, it is not confined to the details set forth and this application is intended to cover such modifications or changes as may come within the purposes of the improvements or the scope of the following claims.

What is claimed is:

1. A processing system, comprising:
    a processing chamber in which a process is to be performed;
    circulating means, having purifying means, for purifying an ambient gas of said processing chamber, and for circulating the purified gas back into said processing chamber;
    a sensor for measuring the purity of the ambient gas; and
    adjusting means for adjusting the purification capacity of said purifying means in accordance with an output of said sensor.

2. A system according to claim 1, wherein at least one of exposure process to a substrate, a coating process to the substrate and a developing process to the substrate are to be performed in said processing chamber.

3. A system according to claim 1, wherein said processing chamber has a reduced inside pressure.

4. A processing system, comprising:
    a first processing chamber in which a first process is to be performed;
    a second processing chamber in which a second process is to be performed;
    wherein the first process to be performed in said first processing chamber requires an ambient gas of higher cleanness or higher purity as compared with the second process to be performed in said second processing chamber;
    and
    means for introducing the ambient gas, having been used in said first processing chamber for the first process, into said second processing chamber for reuse therein.

5. A system according to claim 4, further comprising circulating means for circulating the ambient gas, having been used in said second processing chamber for the second process, back into said first processing chamber for reuse.

6. A system according to claim 5, further comprising purifying means for purifying the ambient gas circulated or to be circulated.

7. A system according to claim 6, further comprising measuring means for measuring the purity of the ambient gas, and adjusting means for adjusting the purification capacity of said purifying means in accordance with an output of said measuring means.

8. A system according to claim 4, wherein the first process comprises an exposure process for a substrate, and wherein the second process comprises at least one of a coating process to the substrate and a developing process to the substrate.

9. A system according to claim 4, wherein at least one of said first and second processing chambers has a reduced inside pressure therein.

10. A system according to claim 1 or 4, wherein the ambient gas comprises an inactive gas.

11. A device manufacturing method for manufacturing a device by using a processing system as recited in any one of claims 1 or 4.

* * * * *

UNITED STATES PATENT AND TRADEMARK OFFICE
CERTIFICATE OF CORRECTION

PATENT NO. : 5,871,587

DATED : February 16, 1999

INVENTOR(S): TAKAYUKI HASEGAWA ET AL.

It is certified that error appears in the above-identified patent and that said Letters Patent is hereby corrected as shown below:

ON TITLE PAGE, AT [54] TITLE

"OF OTHERWISE" should be deleted.

ON TITLE PAGE, AT [56] REFERENCES CITED, FOREIGN PATENT DOCS.

"A03175224" should read --03-175224--.

COLUMN 1

Line 3, "OF OTHERWISE" should be deleted;
Line 26, "due to" should be deleted;
Line 62, "ambience" should read --ambient--.

COLUMN 2

Line 29, "ultra high" should read --ultra-high--;
Line 33, "ultra high" should read --ultra-high--.

COLUMN 3

Line 66, "11," should read --11--.

COLUMN 4

Line 2, "just" should be deleted;
Line 48, "ultra high" should read --ultra-high--.

UNITED STATES PATENT AND TRADEMARK OFFICE
CERTIFICATE OF CORRECTION

PATENT NO.  : 5,871,587

DATED       : February 16, 1999

INVENTOR(S) : TAKAYUKI HASEGAWA ET AL.

It is certified that error appears in the above-identified patent and that said Letters Patent is hereby corrected as shown below:

<u>COLUMN 6</u>

Line 25, "ambience" should read --ambient--;
Line 56, "and" should read --is--.

<u>COLUMN 8</u>

Line 40, "of" should read --of an--.

Signed and Sealed this

Eleventh Day of April, 2000

Attest:

Q. TODD DICKINSON

*Attesting Officer*   *Director of Patents and Trademarks*

UNITED STATES PATENT AND TRADEMARK OFFICE
CERTIFICATE OF CORRECTION

PATENT NO.    : 5,871,587

DATED         : February 16, 1999

INVENTOR(S)   : TAKAYUKI HASEGAWA ET AL.

It is certified that error appears in the above-identified patent and that said Letters Patent is hereby corrected as shown below:

COLUMN 3

Line 12, "ambience" should read --ambient--.

COLUMN 8

Line 33, "chamber" should read --chamber by removing gaseous impurities from the ambient gas,--.

Signed and Sealed this

Sixth Day of March, 2001

Attest:

NICHOLAS P. GODICI

Attesting Officer    Acting Director of the United States Patent and Trademark Office